United States Patent
Parkhe et al.

(10) Patent No.: US 12,243,756 B2
(45) Date of Patent: Mar. 4, 2025

(54) TEMPERATURE CONTROLLED SUBSTRATE SUPPORT ASSEMBLY

(71) Applicant: Applied Materials, Inc., Santa Clara, CA (US)

(72) Inventors: Vijay D. Parkhe, San Jose, CA (US); Konstantin Makhratchev, Fremont, CA (US); Masanori Ono, Chiba (JP); Zhiqiang Guo, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 711 days.

(21) Appl. No.: 17/483,509

(22) Filed: Sep. 23, 2021

(65) Prior Publication Data
US 2022/0013374 A1 Jan. 13, 2022

Related U.S. Application Data

(63) Continuation of application No. 14/285,606, filed on May 22, 2014, now Pat. No. 11,158,526.

(60) Provisional application No. 61/937,348, filed on Feb. 7, 2014.

(51) Int. Cl.
*H01L 21/67* (2006.01)
*H01L 21/683* (2006.01)

(52) U.S. Cl.
CPC .. *H01L 21/67103* (2013.01); *H01L 21/67248* (2013.01); *H01L 21/6831* (2013.01)

(58) Field of Classification Search
CPC ........ H01L 21/67098; H01L 21/67103; H01L 21/67109; H01L 21/67248; H01L 21/6831; H01L 21/6833; H05B 1/02; H05B 1/0202; H05B 1/0227; H05B 1/0233

See application file for complete search history.

(56) References Cited

U.S. PATENT DOCUMENTS

| | | | |
|---|---|---|---|
| 6,490,146 B2 | 12/2002 | Wang et al. | |
| 6,538,872 B1 | 3/2003 | Wang et al. | |
| 6,653,603 B2 | 11/2003 | Yamaguchi | |
| 6,740,853 B1 | 5/2004 | Johnson et al. | |

(Continued)

FOREIGN PATENT DOCUMENTS

| | | |
|---|---|---|
| CN | 201435414 Y | 3/2010 |
| CN | 102668058 A | 9/2012 |

(Continued)

OTHER PUBLICATIONS

Office Action from JP 2021-193875 dated Sep. 27, 2022.

(Continued)

*Primary Examiner* — Hung D Nguyen
(74) *Attorney, Agent, or Firm* — Patterson + Sheridan, LLP

(57) ABSTRACT

Implementations described herein provide a substrate support assembly which enables both lateral and azimuthal tuning of the heat transfer between an electrostatic chuck and a heater assembly. The substrate support assembly comprises an upper surface and a lower surface; one or more main resistive heaters disposed in the substrate support; and a plurality of heaters in column with the main resistive heaters and disposed in the substrate support. A quantity of the heaters is an order of magnitude greater than a quantity of the main resistive heaters and the heaters are independently controllable relative to each other as well as the main resistive heater.

20 Claims, 9 Drawing Sheets

(56) References Cited

U.S. PATENT DOCUMENTS

| | | | |
|---|---|---|---|
| 6,956,186 B1 * | 10/2005 | Ito | G05D 23/1917 219/465.1 |
| 8,226,769 B2 | 7/2012 | Matyushkin et al. | |
| 8,461,674 B2 | 6/2013 | Gaff et al. | |
| 8,546,732 B2 | 10/2013 | Singh | |
| 8,587,113 B2 | 11/2013 | Gaff et al. | |
| 8,624,168 B2 | 1/2014 | Gaff et al. | |
| 8,637,794 B2 | 1/2014 | Singh et al. | |
| 8,642,480 B2 | 2/2014 | Gaff et al. | |
| 8,663,391 B2 | 3/2014 | Matyushkin et al. | |
| 8,884,194 B2 | 11/2014 | Singh et al. | |
| 8,937,800 B2 | 1/2015 | Lubomirsky et al. | |
| 9,196,514 B2 | 11/2015 | Parkhe et al. | |
| 2005/0217799 A1 | 10/2005 | O'Meara et al. | |
| 2006/0151465 A1 | 7/2006 | Lin et al. | |
| 2008/0017104 A1 | 1/2008 | Matyushkin et al. | |
| 2009/0274590 A1 | 11/2009 | Willwerth et al. | |
| 2010/0163188 A1 | 7/2010 | Tanaka et al. | |
| 2011/0068084 A1 * | 3/2011 | Tatsuhiko | H01L 21/6831 156/345.52 |
| 2011/0090719 A1 | 4/2011 | Benjamin | |
| 2011/0147363 A1 | 6/2011 | Yap et al. | |
| 2012/0285619 A1 | 11/2012 | Matyushkin et al. | |
| 2013/0068750 A1 | 3/2013 | Gaff et al. | |
| 2013/0072035 A1 | 3/2013 | Gaff et al. | |
| 2013/0161305 A1 | 6/2013 | Ptasienski et al. | |
| 2013/0220989 A1 | 8/2013 | Pease et al. | |
| 2013/0269368 A1 | 10/2013 | Gaff et al. | |
| 2014/0004702 A1 | 1/2014 | Singh | |
| 2014/0020834 A1 | 1/2014 | Zhou et al. | |
| 2014/0045337 A1 | 2/2014 | Singh et al. | |
| 2014/0047705 A1 | 2/2014 | Singh et al. | |
| 2014/0048529 A1 | 2/2014 | Pease | |
| 2014/0096909 A1 | 4/2014 | Singh et al. | |
| 2014/0154819 A1 | 6/2014 | Gaff et al. | |
| 2015/0129165 A1 | 5/2015 | Parkhe et al. | |
| 2015/0155193 A1 | 6/2015 | Hsu et al. | |
| 2015/0170977 A1 | 6/2015 | Singh | |
| 2015/0187625 A1 | 7/2015 | Busche et al. | |
| 2015/0187626 A1 | 7/2015 | Parkhe et al. | |
| 2015/0228513 A1 | 8/2015 | Parkhe et al. | |
| 2015/0311105 A1 | 10/2015 | Sadjadi et al. | |
| 2015/0364354 A1 | 12/2015 | Tantiwong et al. | |
| 2015/0366004 A1 | 12/2015 | Nangoy et al. | |
| 2016/0027678 A1 | 1/2016 | Parkhe et al. | |

FOREIGN PATENT DOCUMENTS

| | | |
|---|---|---|
| CN | 102844854 A | 12/2012 |
| CN | 103370778 A | 10/2013 |
| JP | H11111823 A | 4/1999 |
| JP | H11505062 A | 5/1999 |
| JP | 2013508968 A | 3/2013 |
| KR | 20120103596 A | 9/2012 |
| WO | 9628842 A1 | 9/1996 |
| WO | 2011049620 A2 | 4/2011 |
| WO | 2013033381 A2 | 3/2013 |
| WO | 2013033394 A2 | 3/2013 |
| WO | 2013154987 A1 | 10/2013 |

OTHER PUBLICATIONS

Japanese Office Action for Application No. 2020-024027 dated May 29, 2023.
International Search Report for PCT/US2015/010468 dated Apr. 28, 2015, 13 pgs.
International Search Report and Written Opinion for PCT/US2014/064735 dated Feb. 24, 2015, 15 pgs.
International Search Report and Written Opinion for PCT/US2015/029725 dated Aug. 19, 2015.
Office Action from Taiwan Patent Application No. 104103592 dated Jul. 23, 2018.
Office Action from Chinese Patent Application No. 201580001498.6 dated Aug. 1, 2018.
Office Action from Japanese Patent Application No. 2016-568792 dated Nov. 14, 2018.
Office Action for Japanese Patent Application No. 2016-568792 dated Oct. 16, 2019.
Office Action from Chinese Patent Application No. 201580001498.6 dated Apr. 2, 2020.
Office Action from Korean Patent Application No. 10-2016-7002581 dated Feb. 1, 2021.
Office Action from Japanese Patent Application No. 2020-024027 dated Feb. 9, 2021.
Office Action from Chinese Patent Application No. 201580001498.6 dated Feb. 9, 2021.
Office Action from JP 2020-091016 dated Jun. 15, 2021.
Office Action from Korean Patent Application No. 10-2021-7033031 dated Jan. 8, 2022.
Japanese Office Action for Application No. 2021-193875 dated Jun. 13, 2023.
Chinese Office Action for Application No. 202110815314.7 dated Aug. 28, 2024.
Chinese Office Action for Application No. 202110820802.7 dated Jul. 19, 2024.

* cited by examiner

TEMPERATURE CONTROLLED SUBSTRATE SUPPORT ASSEMBLY

CROSS-REFERENCE TO RELATED APPLICATIONS

This application is a continuation of U.S. Non-Provisional patent application Ser. No. 14/285,606 filed on May 22, 2014 which claims benefit of U.S. Provisional Application Ser. No. 61/937,348, filed Feb. 7, 2014, each of which are herein incorporated by reference in its entirety.

BACKGROUND

Field

Implementations described herein generally relate to semiconductor manufacturing and more particularly to temperature controlled substrate support assembly and method of using the same.

Description of the Related Art

As the feature size of the device patterns get smaller, the critical dimension (CD) requirements of these features become a more important criterion for stable and repeatable device performance. Allowable CD variation across a substrate processed within a processing chamber is difficult to achieve due to chamber asymmetries such as chamber and substrate temperature, flow conductance, and RF fields.

In processes utilizing an electrostatic chuck, uniformity of temperature control across the surface of the substrate is even more challenging due to the non-homogeneous construction of the chuck below the substrate. For example, some regions of the electrostatic chuck have gas holes, while other regions have lift pin holes that are laterally offset from the gas holes. Still other regions have chucking electrodes, while other regions have heater electrodes that are laterally offset from the chucking electrodes. Since the structure of the electrostatic chuck can vary both laterally and azimuthally, uniformity of heat transfer between the chuck and substrate is complicated and very difficult to obtain, resulting in local hot and cold spots across the chuck surface, which consequently result in non-uniformity of processing results along the surface of the substrate.

The lateral and azimuthal uniformity of heat transfer between the chuck and substrate is further complicated by heat transfer schemes commonly utilized in conventional substrate supports to which the electrostatic chuck is mounted. For example, conventional substrate supports typically have only edge to center temperature control. Thus, local hot and cold spots within the electrostatic chuck cannot be compensated for while utilizing the heat transfer features of the conventional substrate supports.

Thus, there is a need for an improved substrate support assembly.

SUMMARY

Implementations described herein provide a substrate support assembly which enables both lateral and azimuthal tuning of the heat transfer between an electrostatic chuck and a heater assembly. The substrate support assembly comprises an upper surface and a lower surface; one or more main resistive heaters disposed in the substrate support; and a plurality of heaters in column with the main resistive heaters and disposed in the substrate support. A quantity of the heaters is an order of magnitude greater than a quantity of the main resistive heaters and the heaters are independently controllable relative to each other as well as the main resistive heater.

In one embodiment, a substrate support assembly comprises a substrate support having a substrate support surface and a lower surface; a plurality of resistive heaters coupled to or disposed in the substrate support, the plurality of resistive heaters independently controllable relative to each other; and a heater controller coupled to the plurality of resistive heaters, wherein the heater controller includes an optics and heater controller.

In yet another embodiment, a processing chamber comprises a chamber body and a substrate support assembly. The substrate support assembly comprises an upper surface and a lower surface; one or more main resistive heaters disposed in the substrate support; and a plurality of heaters in column with the main resistive heaters and disposed in the substrate support. A quantity of the heaters is an order of magnitude greater than a quantity of the main resistive heaters and the heaters are independently controllable relative to each other as well as the main resistive heater.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations described herein provide a substrate support assembly which enables both lateral and azimuthal tuning of the temperature of an electrostatic chuck comprising the substrate support assembly, which in turn, allows both lateral and azimuthal tuning of the lateral temperature profile of a substrate processed on the substrate support assembly. Moreover, the substrate support assembly also enables local hot or cold spots on the substrate to be substantially eliminated. Methods for tuning of a lateral temperature profile a substrate processed on a substrate support assembly are also described herein. Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where azimuthal tuning of a lateral temperature profile is desirable. It is also contemplated that the heaters may also be utilized to control the temperature of other surfaces, including those not used for semiconductor processing.

In one or more embodiments, the substrate support assembly allows for the correction of critical dimension (CD) variation at the edge of the substrate during vacuum process, such as etching, deposition, implantation and the like, by allowing the substrate temperature to be utilized to compensate for chamber non-uniformities, such as temperature, flow conductance, electrical fields, plasma density and the like. Additionally, some embodiments have demonstrated the ability to control the temperature uniformity across the substrate to less than about ±0.3 degrees Celsius.

Figure 1:
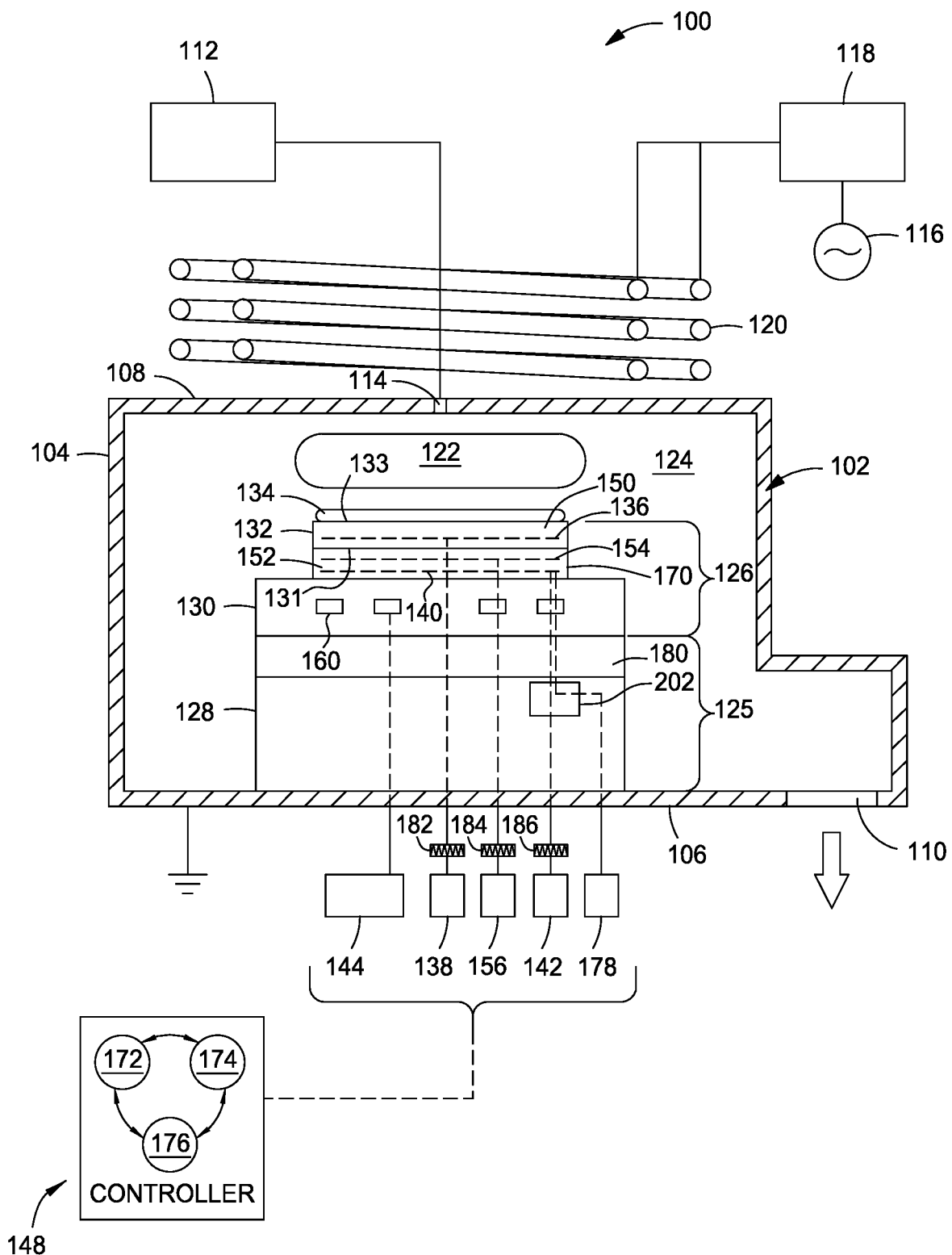
FIG. 1 is a cross-sectional schematic side view of a processing chamber having one embodiment of a substrate support assembly.

FIG. 1 is a cross-sectional schematic view of an exemplary etch processing chamber 100 having a substrate support assembly 126. As discussed above, the substrate support assembly 126 may be utilized in other processing chamber, for example plasma treatment chambers, annealing chambers, physical vapor deposition chambers, chemical vapor deposition chambers, and ion implantation chambers, among others, as well as other systems where the ability to control a temperature profile of a surface or workpiece, such as a substrate, is desirable. Independent and local control of the temperature across many discrete regions across a surface beneficially enables azimuthal tuning of the temperature profile, center to edge tuning of the temperature profile, and reduction of local temperature asperities, such as hot and cool spots.

The processing chamber 100 includes a grounded chamber body 102. The chamber body 102 includes walls 104, a bottom 106 and a lid 108 which enclose an internal volume 124. The substrate support assembly 126 is disposed in the internal volume 124 and supports a substrate 134 thereon during processing.

The walls 104 of the processing chamber 100 include an opening (not shown) through which the substrate 134 may be robotically transferred into and out of the internal volume 124. A pumping port 110 is formed in one of the walls 104 or the bottom 106 of the chamber body 102 and is fluidly connected to a pumping system (not shown). The pumping system is utilized to maintain a vacuum environment within the internal volume 124 of the processing chamber 100, while removing processing byproducts.

A gas panel 112 provides process and/or other gases to the internal volume 124 of the processing chamber 100 through one or more inlet ports 114 formed through at least one of the lid 108 or walls 104 of the chamber body 102. The process gas provided by the gas panel 112 are energized within the internal volume 124 to form a plasma 122 utilized to process the substrate 134 disposed on the substrate support assembly 126. The process gases may be energized by RF power inductively coupled to the process gases from a plasma applicator 120 positioned outside the chamber body 102. In the embodiment depicted in FIG. 1, the plasma applicator 120 is a pair of coaxial coils coupled through a matching circuit 118 to an RF power source 116.

A controller 148 is coupled to the processing chamber 100 to control operation of the processing chamber 100 and processing of the substrate 134. The controller 148 may be one of any form of general-purpose data processing system that can be used in an industrial setting for controlling the various subprocessors and subcontrollers. Generally, the controller 148 includes a central processing unit (CPU) 172 in communication with memory 174 and input/output (I/O) circuitry 176, among other common components. Software commands executed by the CPU of the controller 148, cause the processing chamber to, for example, introduce an etchant gas mixture (i.e., processing gas) into the internal volume 124, form the plasma 122 from the processing gas by application of RF power from the plasma applicator 120, and etch a layer of material on the substrate 134.

The substrate support assembly 126 generally includes at least a substrate support 132. The substrate support 132 may be a vacuum chuck, an electrostatic chuck, a susceptor, or other workpiece support surface. In the embodiment of FIG. 1, the substrate support 132 is an electrostatic chuck and will be described hereinafter as the electrostatic chuck 132. The substrate support assembly 126 may additionally include a heater assembly 170. The substrate support assembly 126 may also include a cooling base 130. The cooling base may alternately be separate from the substrate support assembly 126. The substrate support assembly 126 may be removably coupled to a support pedestal 125. The support pedestal 125, which may include a pedestal base 128 and a facility plate 180, is mounted to the chamber body 102. The substrate support assembly 126 may be periodically removed from the support pedestal 125 to allow for refurbishment of one or more components of the substrate support assembly 126.

The facility plate 180 is configured to accommodate a plurality of driving mechanism configured to raise and lower a plurality of lifting pins. Additionally, the facility plate 180 is configured to accommodate the plurality of fluid connections from the electrostatic chuck 132 and the cooling base 130. The facility plate 180 is also configured to accommodate the plurality of electrical connections from the electrostatic chuck 132 and the heater assembly 170. The myriad of connections may run externally or internally of the substrate support assembly 126 while the facility plate 180 provides an interface for the connections to a respective terminus.

The electrostatic chuck 132 has a mounting surface 131 and a workpiece surface 133 opposite the mounting surface 131. The electrostatic chuck 132 generally includes a chucking electrode 136 embedded in a dielectric body 150. The chucking electrode 136 may be configured as a mono polar or bipolar electrode, or other suitable arrangement. The chucking electrode 136 is coupled through an RF filter 182 to a chucking power source 138 which provides a RF or DC power to electrostatically secure the substrate 134 to the upper surface of the dielectric body 150. The RF filter 182 prevents RF power utilized to form a plasma 122 within the processing chamber 100 from damaging electrical equipment or presenting an electrical hazard outside the chamber. The dielectric body 150 may be fabricated from a ceramic material, such as AlN or $Al_2O_3$. Alternately, the dielectric body 150 may be fabricated from a polymer, such as polyimide, polyetheretherketone, polyaryletherketone and the like.

The workpiece surface 133 of the electrostatic chuck 132 may include gas passages (not shown) for providing backside heat transfer gas to the interstitial space defined between the substrate 134 and the workpiece surface 133 of the electrostatic chuck 132. The electrostatic chuck 132 may also include lift pin holes for accommodating lift pins (both not shown) for elevating the substrate 134 above the workpiece surface 133 of the electrostatic chuck 132 to facilitate robotic transfer into and out of the processing chamber 100.

The temperature controlled cooling base 130 is coupled to a heat transfer fluid source 144. The heat transfer fluid source 144 provides a heat transfer fluid, such as a liquid, gas or combination thereof, which is circulated through one or more conduits 160 disposed in the base 130. The fluid flowing through neighboring conduits 160 may be isolated to enable local control of the heat transfer between the electrostatic chuck 132 and different regions of the cooling base 130, which assists in controlling the lateral temperature profile of the substrate 134.

A fluid distributor may be fluidly coupled between an outlet of the heat transfer fluid source 144 and the temperature controlled cooling base 130. The fluid distributor operates to control the amount of heat transfer fluid provided to the conduits 160. The fluid distributor may be disposed outside of the processing chamber 100, within the substrate support assembly 126, within the pedestal base 128 or other suitable location.

The heater assembly 170 may include one or more main resistive heaters 154 and/or a plurality of heaters 140 embedded in a body 152. The main resistive heaters 154 may be provided to elevate the temperature of the substrate support assembly 126 to a temperature for conducting chamber processes. The heaters 140 provide localized adjustments to the temperature profile of the substrate support assembly 126 generated by the main resistive heaters 154. Thus, the main resistive heaters 154 operate on a globalized macro scale while the heaters operate on a localized micro scale. The main resistive heaters 154 are coupled through an RF filter 184 to a main heater power source 156. The power source 156 may provide 500 watts or more power to the main resistive heaters 154. The controller 148 may control the operation of the main heater power source 156, which is generally set to heat the substrate 134 to about predefined temperature. In one embodiment, the main resistive heaters 154 include a plurality of laterally separated heating zones, wherein the controller 148 enables one zone of the main resistive heaters 154 to be preferentially heated relative to the main resistive heaters 154 located in one or more of the other zones. For example, the main resistive heaters 154 may be arranged concentrically in a plurality of separated heating zones.

The heaters 140 are coupled through an RF filter 186 to a heater power source 142. The heater power source 142 may provide 10 watts or less power to the heaters 140. In one embodiment, the power supplied by the heater power source 142 is an order of magnitude less than the power supplied by the power source 156 of the main resistive heaters. The heaters 140 may additionally be coupled to a controller 202. The controller 202 may be located within or external to the substrate support assembly 126. The controller 202 may manage the power provided from heater power source 142 to individual or groups of heaters 140 in order to control the heat generated locally at each heaters 140 distributed laterally across the substrate support assembly 126. An optical power source 178 may couple the controller 202 to the controller 148 to decouple the controller 148 from influence of the RF energy with the processing chamber 100.

Alternately, the one or more main resistive heaters 154, and/or the heaters 140, may be formed in the electrostatic chuck 132. In an embodiment where both the main resistive heaters 154 and the heaters 140 are formed in the electrostatic chuck 132, the substrate support assembly 126 may be formed without the heater assembly 170 and the electrostatic chuck 132 may be disposed directly on the cooling base 130.

The electrostatic chuck 132 may include one or more thermocouples (not shown) for providing temperature feedback information to the controller 148 for controlling the power applied by the main heater power source 156 to the main resistive heaters 154, for controlling the operations of the cooling base 130, and controlling the power applied by the heater power source 142 to the heaters 140.

The temperature of the surface for the substrate 134 in the processing chamber 100 may be influenced by the evacuation of the process gasses by the pump, the slit valve door, the plasma 122 and other factors. The cooling base 130, the one or more main resistive heaters 154, and the heaters 140 all help to control the surface temperature of the substrate 134.

In a two zone configuration of main resistive heaters 154, the main resistive heaters 154 may be used to heat the substrate 134 to a temperature suitable for processing with a variation of about +/−10 degrees Celsius from one zone to another. In a four zone assembly for the main resistive heaters 154, the main resistive heaters 154 may be used to heat the substrate 134 to a temperature suitable for processing with a variation of about +/−1.5 degrees Celsius within a particular zone. Each zone may vary from adjacent zones from about 0 degrees Celsius to about 20 degrees Celsius depending on process conditions and parameters. However, the requirement for minimizing variations in the critical dimensions across a substrate has reduced the acceptable variation in a determined process temperature of the surface of the substrate surface. A half a degree variation of the surface temperature for the substrate 134 may result in as much as a nanometer difference in the formation of structures therein. The heaters 140 improve the temperature profile of the surface of the substrate 134 produced by the main resistive heaters 154 by reducing variations in the temperature profile to about +/−0.3 degrees Celsius. The temperature profile may be made uniform or to precisely vary in a predetermined manner across regions of the substrate 134 through the use of the heaters 140 to enable realization of desired results.

Figure 2:
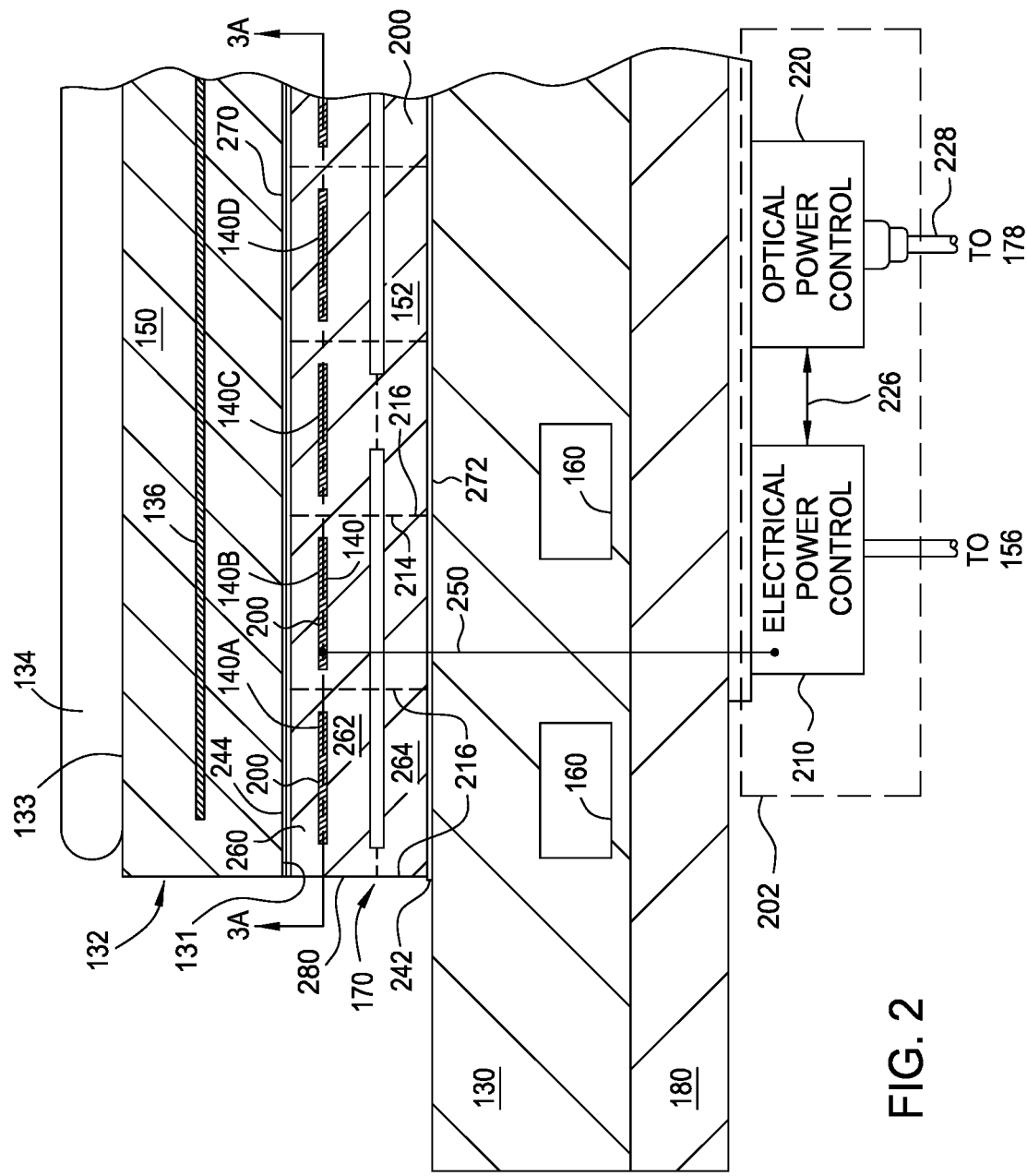
FIG. 2 is a partial cross-sectional schematic side view detailing portions of the substrate support assembly.

FIG. 2 is a partial cross-sectional schematic view illustrating portions of the substrate support assembly 126. Included in FIG. 2 are portions of the electrostatic chuck 132, the heater assembly 170 and the facility plate 180.

The body 152 of the heater assembly 170 may be fabricated from a polymer such as a polyimide. The body 152 may generally be cylindrical in plan form, but may also be formed in other geometrical shapes. The body 152 has an upper surface 270 and a lower surface 272. The upper surface 270 faces the electrostatic chuck 132, while the lower surface 272 faces the cooling base 130.

The body 152 of the heater assembly 170 may be formed from two or more dielectric layers (shown in FIG. 2 as three dielectric layers 260, 262, 264) and heating the layers 260, 262, 264 under pressure to form a single body 152. For example, the body 152 may be formed from polyimide layers 260, 262, 264, which separate the main resistive heaters and heaters 154, 140, which are heated under pressure to form the single body 152 of the heater assembly 170. The heaters 140 may be placed in, on or between the first, second or third layers 260, 262, 264 prior to forming the body 152. Additionally, the main resistive heaters 154 may be placed in, on or between on the first, second or third layers 260, 262, 264 prior to assembly, with at least one of the layers 260, 262, 264 separating and electrically insulating the heaters 154, 140. In this manner, the heaters 140 and the main resistive heaters 154 become an integral part of the heater assembly 170.

Alternate configurations for locations of the main resistive heaters 154 and the heaters 140 may place one or both heaters 154, 140 in or under the electrostatic chuck 132. FIGS. 4A-4E are partial schematic views of the substrate support assembly 126 detailing various locations for the heaters 140 and the main resistive heaters 154, although not limiting to all embodiments.

Figure 4A:
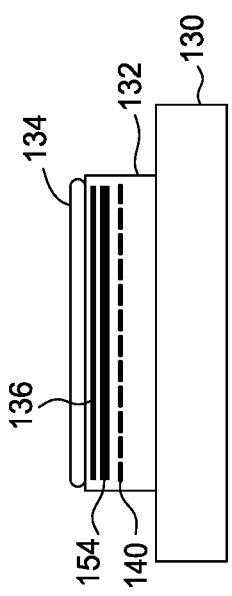
FIG. 4A-4E are partial schematic side views of illustrating various locations for heaters and main resistive heaters within a substrate support.
Figure 4C:
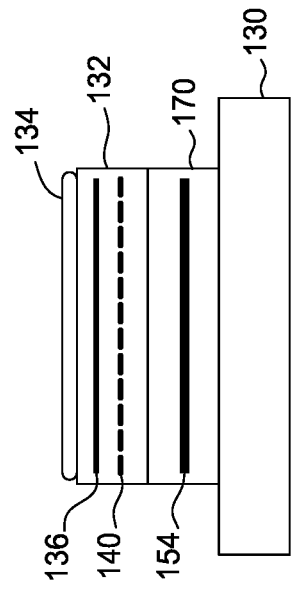
Figure 4B:
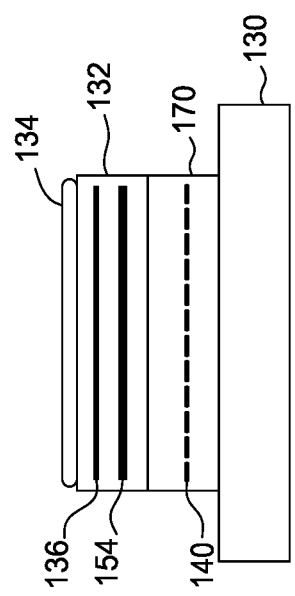
Figure 4E:
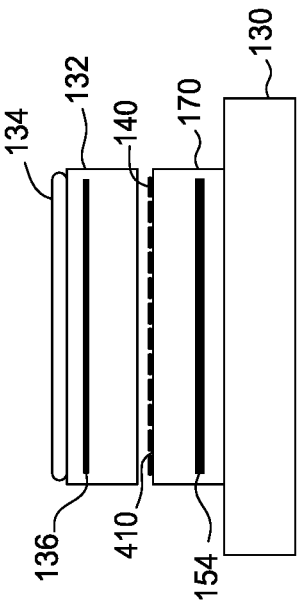
Figure 4D:
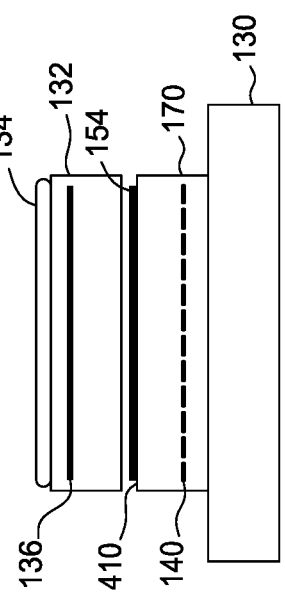

In the embodiment depicted in FIG. 4A, the substrate support assembly 126 does not have a heater assembly (170) and the heaters 140 and the main resistive heaters 154 are disposed in the electrostatic chuck 132, for example, below the chucking electrode 136. Although the heaters 140 are shown below the main resistive heaters 154, the heaters 140 may be alternatively positioned above the main resistive heaters 154. In the embodiment depicted in FIG. 4B, the heater assembly 170 for the substrate support assembly 126 includes the heaters 140 while the main resistive heaters 154 are disposed in the electrostatic chuck 132, for example, below the chucking electrode 136. Alternatively, the heaters 140 may be disposed in the electrostatic chuck 132 while the main resistive heaters 154 are disposed in the heater assembly 170. In the embodiment depicted in FIG. 4C, the heater assembly 170 for the substrate support assembly 126 has the main resistive heaters 154 disposed therein. The heaters 140 are disposed in the electrostatic chuck 132, for example, below the chucking electrode 136. In the embodiment depicted in FIG. 4D, the heater assembly 170 for the substrate support assembly 126 has heaters 140 disposed therein while the main resistive heaters 154 are disposed on one of the heater assembly 170 or the electrostatic chuck 132. The heater assembly 170 isolates the heaters 140 from the cooling base 130. In the embodiment depicted in FIG. 4E, the heater assembly 170 of the substrate support assembly 126 has main resistive heaters 154 disposed therein. The heaters 140 are disposed in or on the heater assembly 170, for example, below the electrostatic chuck 132. It is contemplated that the heaters 140 and the main resistive heaters 154 may be arranged in other orientations. For example, the substrate support assembly 126 may only have the plurality of heaters 140 for heating the substrate 134. In one embodiment, the heaters 140 and the main resistive heaters 154 are disposed directly under each other within substrate support assembly 126. The heaters 140 provide fine tune control for the temperature profile of the substrate 134 supported by the substrate support assembly 126.

The heaters 140 may be formed or disposed on or in the body 152 of the heater assembly 170 or electrostatic chuck 132. The heaters 140 may be formed by plating, ink jet printing, screen printing, physical vapor deposition, stamping, wire mesh or other suitable manner. In this manner fabrication of the substrate support assembly 126 is simplified. In one embodiment, the heaters 140 are disposed within the heater assembly 170 while forming the heater assembly 170. In another embodiment, the heaters 140 are directly disposed on the mounting surface 131 of the electrostatic chuck 132. For example, the heaters 140 may be in a sheet form which can be adhered to the mounting surface 131 of the electrostatic chuck 132, or the heaters may be deposited by other means. For example, the heaters 140 can be deposited on the mounting surface 131 by physical vapor deposition, chemical vapor deposition, screen printing or other suitable methods. The main resistive heaters 154 can be in the electrostatic chuck 132 or heater assembly 170 as shown above.

The main resistive heaters 154 may be formed or disposed on or in the body 152 of the heater assembly 170 or electrostatic chuck 132. The main resistive heaters 154 may be formed by plating, ink jet printing, screen printing, physical vapor deposition, stamping, wire mesh or other suitable manner. In this manner fabrication of the substrate support assembly 126 is simplified. In one embodiment, main resistive heaters 154 are disposed within the heater assembly 170 while forming the heater assembly 170. In another embodiment, main resistive heaters 154 are directly disposed on the mounting surface 131 of the electrostatic chuck 132. For example, main resistive heaters 154 may be in a sheet form which can be adhered to the mounting surface 131 of the electrostatic chuck 132, or main resistive heaters 154 may be deposited by other means. For example, main resistive heaters 154 can be deposited on the mounting surface 131 by physical vapor deposition, chemical vapor deposition, screen printing or other suitable methods. The heaters 140 can be in the electrostatic chuck 132 or heater as shown above.

In some embodiments, the main resistive heaters 154 may be fabricated similar to the heaters 140, and in such embodiments, may optionally be utilized without benefit of additional heaters 140. In other words, the main resistive heaters 154 of the substrate support assembly 126 are, that is, segmented in to a plurality of discrete resistive heating elements. Segmenting the main resistive heaters 154 in the form of small resistive heaters allows local control of hot and cold spots on the surface of the substrate 134. An additional layer of heaters 140 is optional, depending on the desired level of temperature control.

Figure 7:
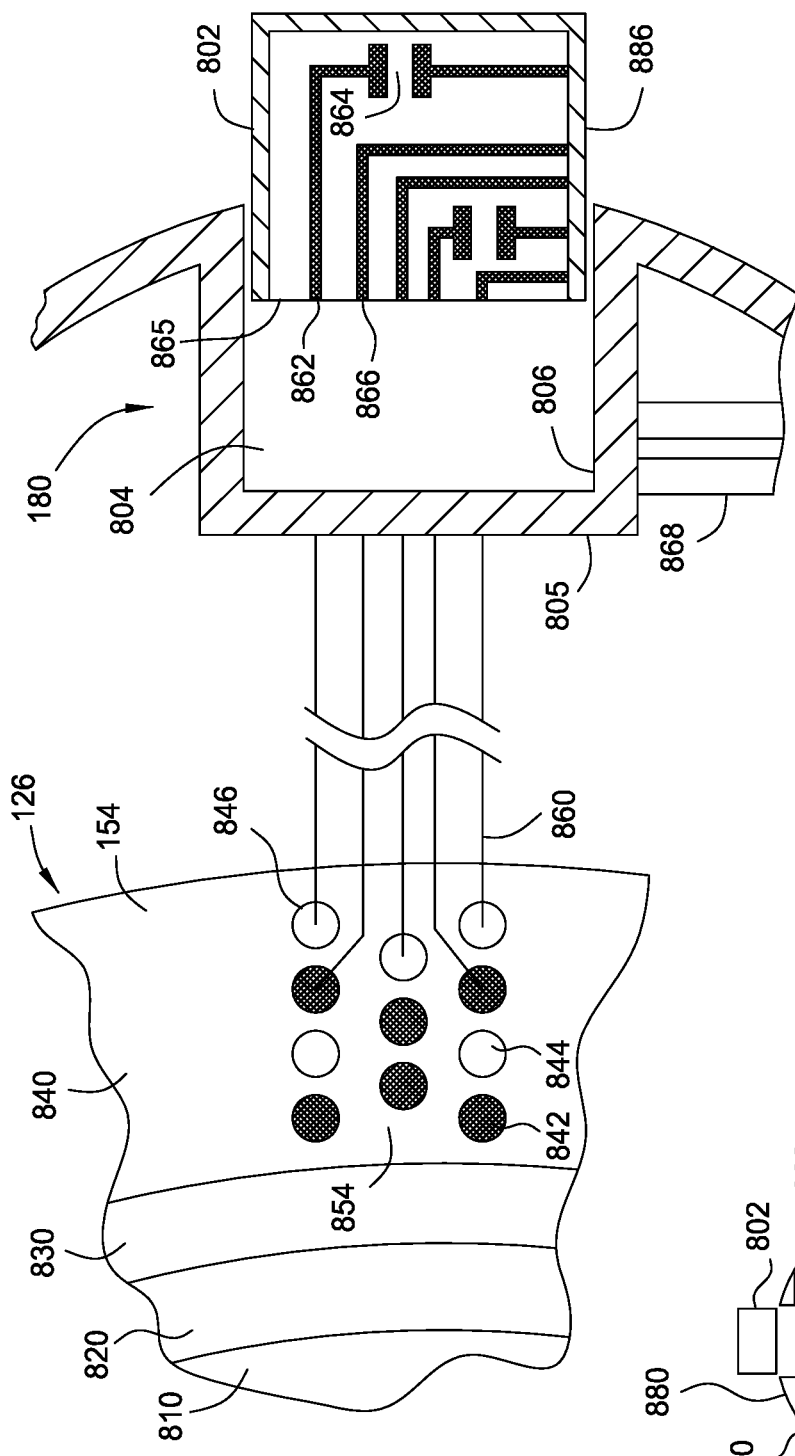
FIG. 7 is a graphical depiction for wiring of the main resistive heaters with a hardware key.

FIG. 7 is a graphical depiction for a wiring layout for a segmented main resistive heaters 154 formed from a plurality of unit heaters 846. The unit heaters 846 may be controlled through use of the controller 202 as described above, or through the use of a heater controller in the form of a hardware wiring key 802 as depicted in FIGS. 7. One implementation for using hardware wiring keys 802 is illustrated in a top plan view of the facility plate 180 shown in FIG. 8.

Figure 8:
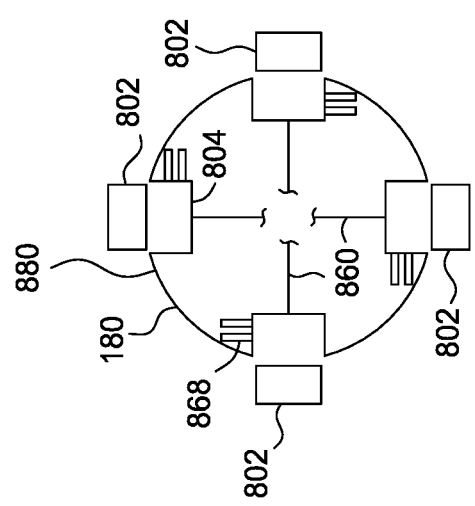
FIG. 8 is a top plan view of a facility plate, configured to use the hardware keys.

Referring jointly to FIGS. 7 and 8, the substrate support assembly 126 may have one or more main resistive heater 154, illustratively shown as four main resistive heaters 154, each defining one of four zones 810, 820, 830, 840. The temperature in each zone 810, 820, 830, 840 may be independently controlled by the main resistive heater 154 associated with zone. Additionally, each main resistive heaters 154 is comprised of a plurality of separated unit heaters 846. The unit heaters 846 may be either active (active unit heaters 842) or inactive (inactive unit heaters 844). Active unit heaters 842 are coupled to a power source and contribute heat to the main resistive heaters 154. The inactive unit heaters 844 are a power source and thus, do not contribute heat to the main resistive heaters 154. Thus, by selectively choosing which main resistive heaters 154 are active unit heaters 842 or inactive unit heaters 844, the temperature profile of the substrate support assembly 126 may be controlled, for example, to control local hot or cold spots, to provide center to edge tuning of the temperature profile, and to provide azimuthal tuning of the lateral temperature profile of the substrate support assembly 126, and consequently, the substrate 134 processed thereon.

The unit heaters 846 for each main resistive heater 154 may be selected to form a pattern of active heater density within each of the zones 810, 820, 830, 840. The pattern of the unit heaters 846 may be tightly packed and uniform, similar to the pattern of unit heaters labeled 854. Alternately, the pattern for the unit heaters 846 may be loosely spaced. The unit heaters 846 may be switched between active unit heaters 842 and inactive unit heaters 844 using hardware, such as the hardware wiring key 802, the controller 202, software or firmware executed by controller 148, or through another method or device. Thus, the temperature profile generated from the main resistive heaters 154 in each of the zones 810, 820, 830, 840 may be refined by selectively activating the unit heaters 846 to control the heat supplied by the main resistive heaters 154.

Each unit heater 846, that is all active unit heaters 842 and all inactive unit heaters 844, has a wired connection 860. The wired connections 860 are routed to a receptacle 804, for example, formed in the facility plate 180. In one embodiment, the wired connections 860 may extend outward of the substrate support assembly 126 and run down the outside of the substrate support assembly 126 to the receptacle 804 in the facility plate 180. Alternately, the wired connection 860 may run internally through the heater assembly 170, for example, through a hole in the cooling base 130 to the receptacle 804 in facility plate 180.

The receptacle 804 in the facility plate 180 has an interior surface 805 and a side surface 806. The wired connections 860 may terminate at the interior surface 805, thus forming a connector or socket. A control board connection 868 may terminate at the side surface 806 with a connector or socket. The control board connection 868 may be a single power lead or a plurality of power leads. The wired connections 860 and the control board connections 868 are part of a circuit. Alternately, the wired connections 860 and the control board connections 868 may both residing on the same surface of the facility plate 180. For example, both the wired connections 860 and the control board connections 868 may reside on an interior surface 805 of the receptacle 804. A gap in the circuit is formed at the receptacle 804 such that no current may flow across the circuit, i.e. from the control board connections 868 to the wired connections 860.

The hardware wiring key 802 is configured to fit in the receptacle 804. The hardware wiring key 802 may be flush with outer surface 880 of the facility plate 180 while a front surface 866 of the hardware wiring key 802 makes contact with the interior surface 805 of the receptacle 804. Additionally, the side surface 886 of the hardware wiring key 802 is in contact the side surface 806 of the receptacle. The hardware wiring key 802 is configured to selectively fill the gap in the circuit at the receptacle 804 such that current may flow from the control board connections 868 to selected wired connections 860. In this manner the electrical connections between the wired connections 860 and the control board connections 868 can be made. Thus, the hardware wiring key 802 is configured to selectively provide power to the unit heaters 846.

The hardware wiring key 802 may use a common negative terminal for each of the wired connections 860. For instance, all the negative terminals may utilize a common bus that may be formed in the jacket of the hardware wiring key 802 or the negative terminal may be a shared pin connection. Alternately, the hardware wiring key 802 may use individual negative terminal for each of the wired connections 860. The negative terminal may have a gate switch or other means for selectively interrupting the flow of current across the terminal.

The hardware wiring key 802 may be formed in a manner to preselect only those circuits which are desired to make active and available to deliver power to the unit heaters 846. The inactive circuits may have gaps or gates 864, unformed circuitry within the hardware wiring key 802, or an insulating cap (not shown), among other suitable means for interrupting the flow of power to the wired connections 860 of the unit heaters 846 within the main resistive heaters 154. Thus, one hardware wiring key 802 may be utilized to provide a predefined lateral temperature distribution of the substrate while performing one process, and replaced by a hardware wiring key 802 having a different preselection of circuits which are desired to make active are available to deliver power to the unit heaters 846 which will yield a different predefined lateral temperature distribution of the substrate while performing another process. In this manner, different hardware wiring keys 802 may be efficiently swapped out to provide different temperature profiles, and accordingly, greater flexibility in ensuring realization of beneficial processing results.

The wired connections 860 may be divided and equally spaced about the outer surface 880 of the facility plate 180. In one embodiment, the facility plate has four receptacles 804, each receptacle having a substantially equal number of wired connections 860. This arrangement allows the substrate support assembly 126 to be symmetrically balanced and minimizes the effects of the wiring on processes occurring within the processing chamber 100. Advantageously, the arrangement of unit heaters 846 and connections provide a homogenous construction for the substrate support assembly 126, and promotes process symmetry.

The unit heaters 846, of the main resistive heaters 154, allow the main resistive heaters 154 to have a temperature range between about ambient to about 500 degrees Celsius with the ability to control the lateral temperature profiled in increments of about 0.3 degrees Celsius. The substrate support assembly 126, having main resistive heaters 154 configured with unit heaters 846, has demonstrated the ability to control the temperature uniformity of a substrate processed thereon to less than about ±1.5 degrees Celsius.

Returning back to the embodiment depicted in FIG. 2, the heater assembly 170 may be coupled to the mounting surface 131 of the electrostatic chuck 132 utilizing a bonding agent 244. The bonding agent 244 may be an adhesive, such as an acrylic-based adhesive, an epoxy, a silicon based adhesive, a neoprene-based adhesive or other suitable adhesive. In one embodiment, the bonding agent 244 is an epoxy. The bonding agent 244 may have a coefficient of thermal conductivity selected in a range from 0.01 to 200 W/mK and, in one exemplary embodiment, in a range from 0.1 to 10 W/mK. The adhesive materials comprising the bonding agent 244 may additionally include at least one thermally conductive ceramic filler, e.g., aluminum oxide ($Al_2O_3$), aluminum nitride (AlN), and titanium diboride ($TiB_2$), and the like.

In one embodiment, the heater assembly 170 is coupled to the cooling base 130 utilizing a bonding agent 242. The bonding agent 242 may be similar to the bonding agent 244 and may be an adhesive, such as an acrylic-based adhesive, an epoxy, a neoprene-based adhesive or other suitable adhesive. In one embodiment, the bonding agent 242 is an epoxy.

The bonding agent 242 may have a coefficient of thermal conductivity selected in a range from 0.01 to 200 W/mK and, in one exemplary embodiment, in a range from 0.1 to 10 W/mK. The adhesive materials comprising the bonding agent 242 may additionally include at least one thermally conductive ceramic filler, e.g., aluminum oxide ($Al_2O_3$), aluminum nitride (AlN), and titanium diboride ($TiB_2$), and the like.

The bonding agents 244, 242 may be removed when refurbishing one or more of the electrostatic chuck 132, the cooling base 130 and the heater assembly 170. In other embodiments, the heater assembly 170 is removably coupled to the electrostatic chuck 132 and to the cooling base 130 utilizing fasteners or clamps (not shown).

The heater assembly 170 includes a plurality of heaters 140, illustratively shown as heaters 140a, 140b, 140c. The heaters 140 are generally an enclosed volume within the heater assembly 170 in which a plurality of resistive heaters effectuate heat transfer between the heater assembly 170 and electrostatic chuck 132. Each heater 140 may be laterally arranged across the heater assembly 170, and thus defined a cell 200 within the heater assembly 170 for locally providing additional heat to region of the heater assembly 170 (and portion of the main resistive heater 154) aligned that cell 200. The number of heaters 140 formed in the heater assembly 170 may vary, and it is contemplated that there is at least an order of magnitude more heaters 140 (and cells 200) greater than the number of the main resistive heaters 154. In one embodiment in which the heater assembly 170 has four main resistive heaters 154, there may be greater than 40 heaters 140. However, it is contemplated that there may be about 200, about 400 or even more heaters 140 in a given embodiment of a substrate support assembly 126 configured for use with a 300 mm substrate. Exemplary distribution of the heaters 140 are described further below with reference to FIGS. 3A-3D.

The cells 200 may be formed through one or more layers 260, 262, 264 comprising the body 152 of the heater assembly 170. In one embodiment, the cells are open to the lower and upper surface 272, 270 of the body 152. The cells may include sidewalls 214. The sidewalls 214 may be comprised of a material (or gap) acting as a thermal choke 216. The thermal chokes 216 are formed in the upper surface 270 of the body 152. The thermal chokes 216 separate and reduce conduction between adjacent cells 200. Thus, by individually and independently controlling the power provided to each heaters 140, and consequently the heat transfer through cell 200, a by approach to temperature control can be realized which enables specific points of the substrate 134 to be heated or cooled, thereby enabling a truly addressable lateral temperature profile tuning and control of the surface of the substrate 134.

An additional thermal choke 216 may be formed between the radially outermost cells 200 and a laterally outermost sidewall 280 of the body 152. This outermost thermal choke 216 located between the cells 200 and the laterally outermost sidewall 280 of the body 152 minimizes heat transfer between the cells 200, adjacent to the laterally outermost sidewall 280, and the internal volume 124 of the processing chamber 100. Thereby allowing more precise temperature control closer to the edge of the substrate support assembly 126, and as a result, better temperature control to the outside diameter edge of the substrate 134.

As discussed above, each heater 140 may be independently coupled a controller 202. The controller 202 may be disposed in the substrate support assembly 126. The controller 202 may regulate the temperature of the heaters 140 in the heater assembly 170 at each cell 200 relative to the other cells 200, or alternatively, regulate the temperature of a group of heaters 140 in the heater assembly 170 across a group of cells 200 relative to the another group of cells 200. The controller 202 may toggle the on/off state or control the duty cycle for individual or groups of the heaters 140. Alternately, the controller 202 may control the amount of power delivered to the individual or groups of heaters 140. For example, the controller 202 may provide one or more heaters 140 ten watts of power, other heaters 140 nine watts of power, and still other heaters one watt of power.

In one embodiment, each cell 200 may be thermally isolated from the neighboring cells 200, for example, using a thermal choke 216, which enables more precise temperature control. In another embodiment, each cell 200 may be thermally joined to an adjacent cell creating an analogue (i.e., smooth or blended) temperature profile along an upper surface 270 of the heater assembly 170. For example, a metal layer, such as aluminum foil, may be used as a thermal spreader between the main resistive heaters 154 and the heaters 140.

The use of independently controllable the heaters 140 to smooth out or correct the temperature profile generated by the main resistive heaters 154 enable control of the local temperature uniformity across the substrate to very small tolerances, thereby enabling precise process and CD control when processing the substrate 134. Additionally, the small size and high density of the heaters 140 relative to the main resistive heaters 154 enables temperature control at specific locations of the substrate support assembly 126, substantially without affecting the temperature of neighboring areas, thereby allowing local hot and cool spots to be compensated for without introducing skewing or other temperature asymmetries. The substrate support assembly 126, having a plurality of heaters 140, has demonstrated the ability to control the temperature uniformity of a substrate 134 processed thereon to less than about ±0.3 degrees Celsius.

Another benefit of some embodiments of the substrate support assembly 126 is the ability to prevent RF power from traveling through control circuitry. For example, the controller 202 may include an electrical power circuit 210 and an optical control circuit 220. The electrical power circuit 210 is coupled to the heaters 140. Each heater 140 has a pair of power leads (connectors 250) which are connected to the electrical power circuit 210. In an exemplary heater assembly 170 having fifty heaters 140, 50 pairs of power leads (connectors 250) are needed for controlling the heaters 140. The RF energy supplied into the processing chamber 100 for forming the plasma couples to the power leads. Filters, such as the RF filters 182, 184, 186 shown in FIG. 1, are used to protect electrical equipment, such as the main heater power source 156, from the RF energy. By terminating the power leads (connectors 250) at the electrical power circuit 210, and utilizing the optical control circuit 220 to control how much power is provided to each heaters 140, only the single RF filter 184 is needed between the electrical power circuit 210 and the power source 156. In conventional applications, each heater requires a dedicated RF filter. Accordingly, as the space for dedicated RF filters very limited, the number of heaters utilized within the substrate support assembly is also limited, thereby limiting the number of main heater zones which may be employed, and making corrective heaters impossible to implement. Thus, the use of the electrical power circuit 210 with the optical control circuit 220 allow more heaters, and consequently, superior lateral temperature control.

Figure 6:
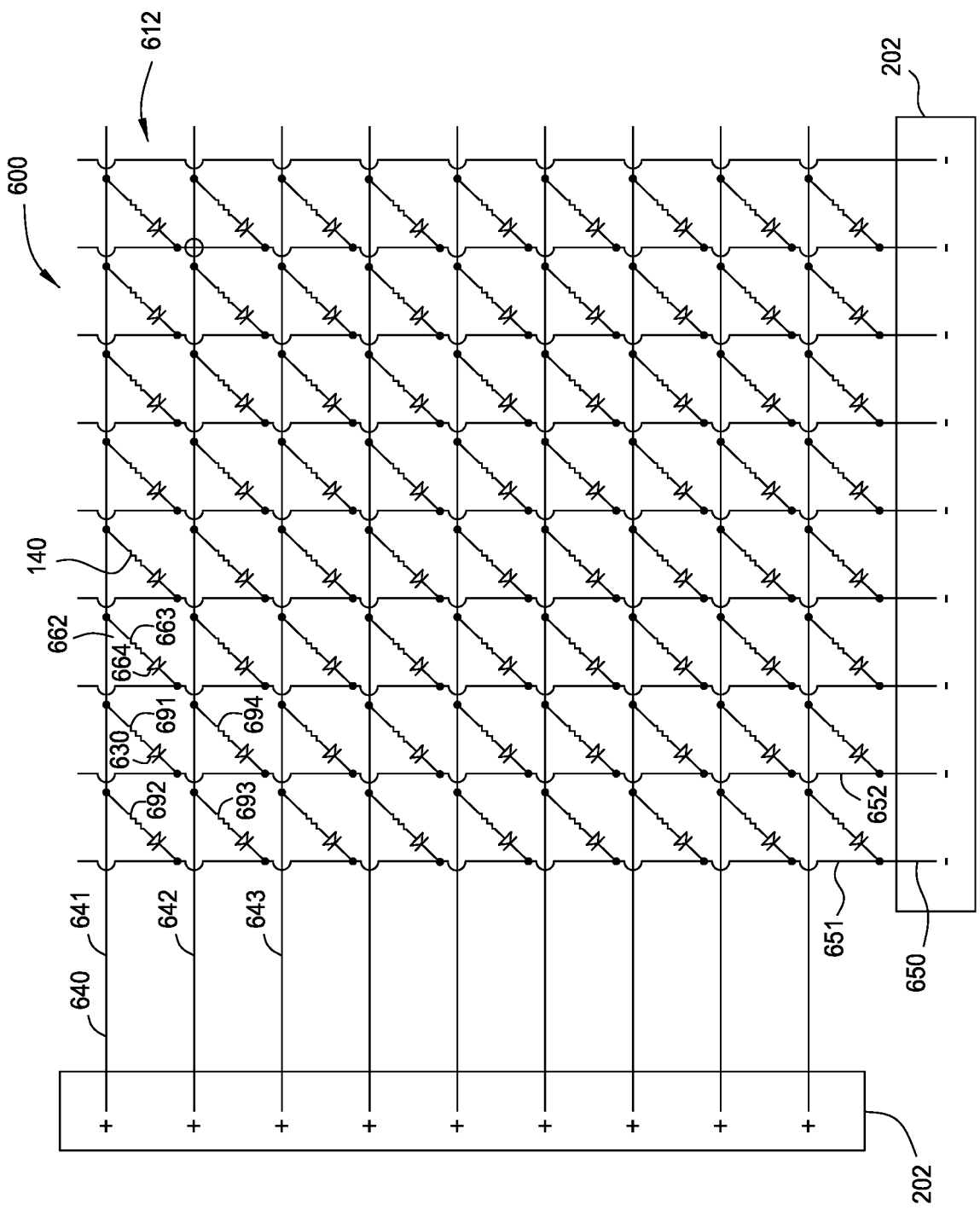
FIG. 6 is a simplified wiring schematic for operating heaters.

Turning briefly to FIG. 6, the simplified wiring schematic for the heaters 140 illustrates the reduced number of RF filters needed to protect electrical chamber components from the RF signal. A flex circuit 600 may be utilized to assist controlling the plurality of heaters 140. The flex circuit 600 may form a matrix pattern with the heaters 140. The flex circuit 600 may consist of a number of non-intersecting positive leads 640 and negative leads 650, each attached at one end to the controller 202. Each positive lead 640 may have a plurality of heater assemblies 662 bridging a connection to a corresponding negative lead 650. Thus, the heater assembly 662 is deposed between each connection of the positive and negative leads 640, 650. In one exemplary embodiment, the flex circuit 600 may have 9 positive leads 640 and 9 negative leads 650 and therefore as many as 81 heater assemblies 662.

The heater assembly 662 has a heater 663 and a diode 664 connected in series. The heater 663 attaches to the positive lead 640 and the diode 664 may attach to the negative lead 650. Alternately, heater 663 attaches to the negative lead 650 and the diode 630 may attach to the positive lead 640. The diode 664 ensures current flows only in one direction. In one embodiment, the direction of the current flow for each of the heater assemblies 662 is from the positive lead 640 to the negative lead 650.

The controller 202 may open and/or close individual circuits to provide a predetermined current flow across a selection of the positive leads 640 and the negative leads 650. For example, the controller 202 may provide for current flow on positive lead labeled 641 and a return flow for the current on negative lead labeled 653, with all other positive and negative leads 640, 650 acting as open circuits. Alternately, the controller 202 may selectively provide for current flow on positive leads labeled 642 and 643 while providing for a return flow on a negative lead 652, with all other positive and negative leads 640, 650 acting as open circuits. The controller 202 may therefore selectively provide current to the heater assemblies 662 disposed between the selected combinations of positive and negative leads 640, 650. The flex circuit 600 completes individual circuits with the fewest number of connections back to the controller 202 for supplying power to each heater 663.

In one embodiment, the controller 202 provides current on the positive lead labeled 641 and a return path for the current is provided on all the negative leads 650. Heaters 140 along the top row 612 are selectively turned on (active) while the remaining of the heaters 140 are inactive. In another embodiment, the controller 202 provides current on the positive leads labeled 641 and 642 and provides a return path for the current on the negative leads labeled 651 and 652. In this configuration, a small group of four heaters 691, 692, 693, 694 are selectively turned on while the remaining heaters 140 remain inactive (i.e., unpowered). Thus, the controller 202 may be utilized to selectively activate various heaters 140 by activating selected the positive leads 640 and selected the negative leads 650. The controller 202 may also control the voltage across or current through a given heater to control the amount of heat generated by a particular heater. The controller 202 may alternatively, or in addition, control the duty cycle for a given heater to control the amount of heat generated by a particular heater over time. The controller 202 may alternatively, or in addition, scan through the heaters to control the amount of heat generated by a particular heater over time.

The flex circuit 600 may be formed in, on, or below, one of the layers 260, 262, 264 comprising the body 152 of the heater assembly 170. The heaters 140 may be disposed above or in conjunction with the flex circuit 600. The flex circuit 600 may be deposited, plated, ink jet printed, screen printed or formed in any suitable manner. The positive leads 640 and the negative leads 650 may form one or more connectors 250 to connect the flex circuit 600 to the controller 202. The connectors 250 may extend internally through the substrate support assembly 126. For example, the cooling base 130 and the facility plate 180 may have one or more passages formed therethrough to accommodate the passage of the connectors 250. The connectors 250 may be divided, positioned or distributed throughout the substrate support assembly 126 in such a manner that balances any effects of the wiring on the plasma processes ongoing in the processing chamber 100. For example, four connectors 250 may pass through four equally spaced passages formed about a center of the substrate support assembly 126. In one embodiment, the flex circuit 600 may be printed on or within the layers of the heater assembly 170 with a hundred or more terminal leads for operating 50 or more heaters 140. In one example, four hundred terminal leads are utilized to provide power to two hundred heaters 140. The terminal leads may be divided into separate flexible strips, such as a ribbon cable or circuit, which may be run through slots formed in the cooling base 130. The flexible strips containing the terminal lead may be run through equally spaced slots formed through the cooling base 130 to the facility plate 180 to provide symmetrical geometry which contributes to symmetrical temperature control and process uniformity.

Returning back to FIG. 2, the electrical power circuit 210 may switch or cycle power to the plurality of connectors 250 coming from the flex circuit 600. The electrical power circuit 210 provides power to each of the connectors 250 to activate one or more heaters 140. Although the electrical power source ultimately supplies power to the plurality of heaters 140, the electrical power circuit 210 has a single power source, i.e. the heater power source 142, and thus only requires only the single filter 184. Advantageously, the space and expense for additional filters are mitigated, while enabling use of many heaters and heater zones.

The optical control circuit 220 may be coupled to the electrical power circuit 210 by an optical cable 226, such as a fiber optic cable, to control the power supplied to the connectors 250 and thus, the heaters 140. The optical control circuit 220 may be coupled to an optical power source 178 through an optical wave guide 228. The optical power source 178 is coupled to the controller 148 for providing signals controlling the function of the heaters 140. The optical cable 226 and optical wave guide 228 are not subject to electromagnetic interference or radio frequency (RF) energy. Thus, an RF filter to protect the optical power source 178 from RF energy in the controller 202 is unnecessary, thereby allowing more space in the substrate support assembly 126 for routing other utilities.

The optical control circuit 220 may send commands, or instruction, to the electrical power circuit 210 for regulating each heater 140 or groups/regions of heaters 140. As seen in the flex circuit 600 of FIG. 6, a single heater 140 or groups/regions of heaters 140 may be activated using a minimum number of connections back to the electrical power circuit 210 and controlled by the optical control circuit 220.

The optical control circuit 220 may be programmed and calibrated by measuring the temperature rise at each heater 140. The temperature rise may be associated with incremental power increases to the heaters 140. For example, the temperature rise may be associated with a percentage increase, for example 5% increase, in the power supplied to the heater 140. A temperature map may be obtained using this method. The map may correlate the CD or temperature to the power distribution curve for each heater 140. Thus, the heater 140 may be used to generate a temperature profile on the substrate based on a program regulating power settings for the individual heaters 140. The logic can be placed directly in the optical control circuit 220 or in an externally connected controller, such as the controller 148.

Figure 3A:
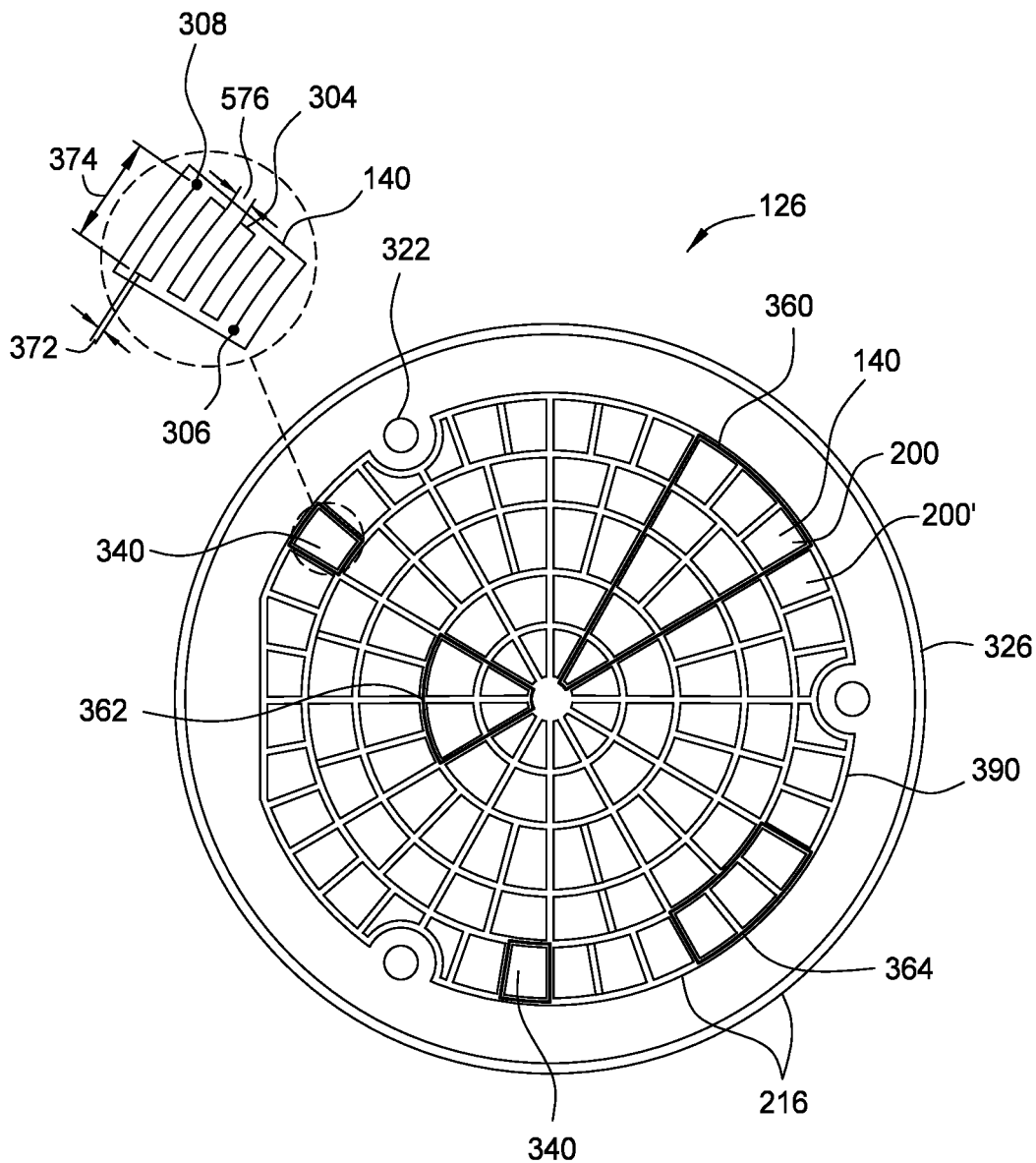
FIG. 3A is a cross-sectional view taken along a section line A-A of FIG. 2.
Figure 3B:
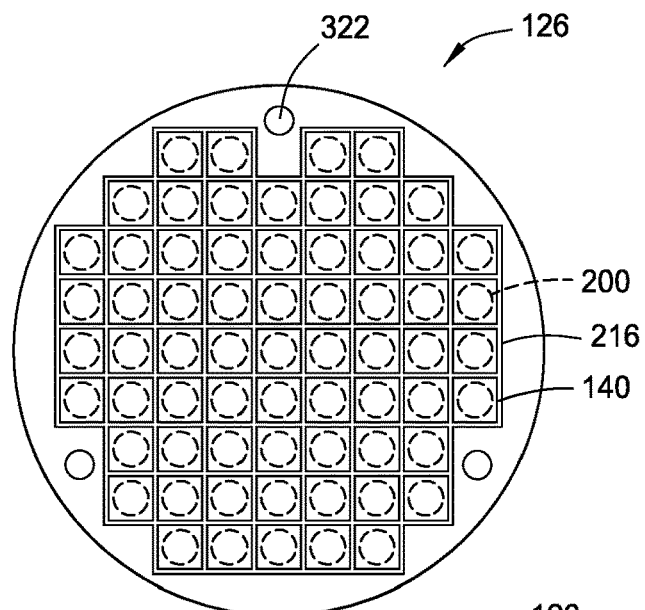
FIGS. 3B-3D are cross-sectional views taken along the section line A-A of FIG. 2, illustrating alternative layouts for heaters.
Figure 3C:
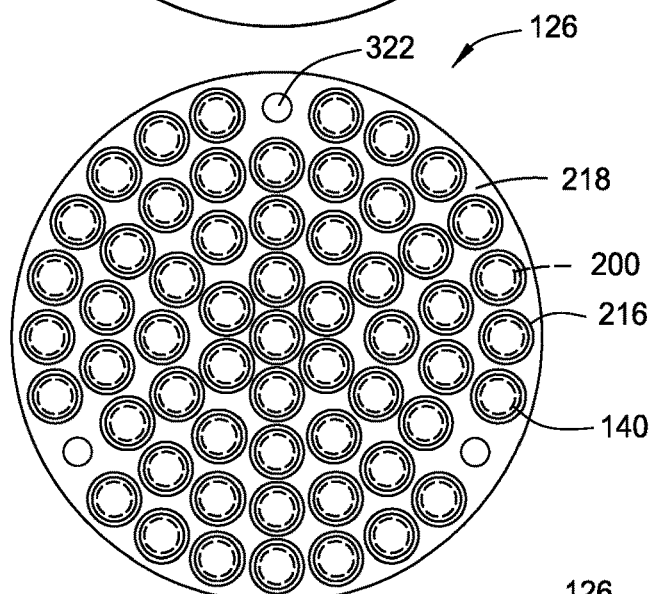
Figure 3D:
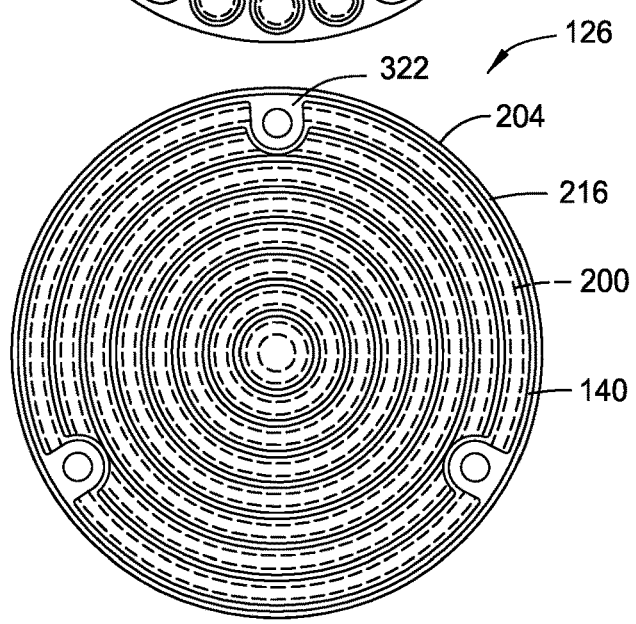

The arrangement of the heaters 140 will now be discussed with reference to FIGS. 3A through 3D. FIG. 3A is a cross-sectional view of FIG. 2 along a section line A-A, according to one embodiment. FIGS. 3B-3D are cross-sectional views along the same section line A-A of FIG. 2, according to alternate embodiments.

Referring now to FIG. 3A, the plurality of heaters 140 are disposed along the plane of the cross section line A-A through the body 152 of the heater assembly 170. The thermal choke 216 is disposed between each neighboring cell 200, each cell 200 associated with at least one of the heaters 140. Additionally, the thermal choke 216 is disposed along an outer surface 326 of the substrate support assembly 126. The number of cells 200 shown are for illustration only, and any number of embodiments may have substantially more (or less) cells 200. The number of heaters 140 may be at least an order of magnitude greater than the number of main resistive heaters 154. The number of heaters 140 located across the substrate support assembly 126 may easily be in excess of several hundred.

Each heater 140 has a resistor 304 ending in terminals 306, 308. As current enters one terminal, such as the terminal labeled 306, and exits the other terminal, such as the terminal labeled 308, the current travels across the wire of the resistor 304 and generates heat. The heater 140 may have a design power density to provide the appropriate temperature rise along the outer surface 326 of the substrate support assembly 126. The amount of heat released by the resistor 304 is proportional to the square of the current passing therethrough. The power design density may be between about 1 watt/cell to about 100 watt/cell, such as 10 watt/cell.

The resistor 304 may be formed from a film of nichrome, rhenium, tungsten, platinum, tantalum or other suitable materials. The resistor 304 may have an electrical resistivity ($\rho$). A low $\rho$ indicates a material that readily allows the movement of an electric charge across the resistor 304. The resistance (R) is dependent on the $\rho$ times the length (I) over the cross sectional area (A) of the wire, or simply $R=\rho \cdot I/A$. Platinum has a $\rho$ of about $1.06 \times 10^{-7}$ ($\Omega \cdot m$) at 20° C. Tungsten has a $\rho$ of about $5.60 \times 10^{-8}$ ($\Omega \cdot m$) at 20° C. Nichrome has a $\rho$ of about $1.1 \times 10^{-8}$ to about $1.5 \times 10^{-8}$ ($\Omega \cdot m$) at 20° C. Of the three aforementioned materials, the resistor 304 comprised of nichrome allows the electrical charge to move more readily, and thus, generate more heat. However, the electrical properties for tungsten may differentiate the material as a resistive heater in certain temperature ranges.

The resistor 304 may have a film thickness (not shown) and a wire thickness 372 configured to efficiently provide heat when a current is passed along the resistor 304. An increase in the wire thickness 372 for the resistor 304 may result in a decrease in the resistance R of the resistor 304. The wire thickness 372 may range from about 0.05 mm to about 0.5 mm for a tungsten wire and about 0.5 mm to about 1 mm for a nichrome wire.

Recalling the formula $R=\rho \cdot I/A$, it can be seen that the material, length of wire, and the wire thickness may be selected for the resistor 304 to control cost, power consumption, and the heat generated by each heater 140. In one embodiment, a resistor 304 is comprised of tungsten having a wire thickness 372 of about 0.08 mm and a resistance of about 50 Ohms at 10 watts of power.

The heaters 140 may be configured in a pattern 390 to efficiently generate a heat profile along the surface of the substrate support assembly 126. The pattern 390 may be symmetric about a midpoint 392 while providing clearance in and around holes 322 for lift pins or other mechanical, fluid or electrical connections. Each heater 140 may be controlled by the controller 202. The controller 202 may turn on a single heater 140 defining a heater 340; or a plurality of heaters 140 grouped to define an inner wedge 362, a perimeter group 364, a pie shaped area 360, or other desired geometric configuration, including non-contiguous configurations. In this manner, temperature can be precisely controlled at independent locations along the surface of the substrate support assembly 126, such independent locations not limited to concentric ring such as known in the art. Although the pattern shown is comprised of smaller units, the pattern may alternatively have larger and/or smaller units, extend to the edge, or have other forms.

FIG. 3B is a top view of the plurality of heaters 140 disposed along the plane of the cross section line AA through the body 152, according to another embodiment. The thermal chokes 216 may optionally be present. The heaters 140 are arranged in the form of a grid, thus defining an array of temperature control cells 200 also arranged in the grid pattern. Although the grid pattern of heaters 140 is shown as an X/Y grid comprised of rows and columns, the grid pattern of heaters 140 may alternatively have some other uniformly packed form, such as a hexagon close pack. It should be appreciated, as discussed supra, the heaters 140 may be activated in groups or singularly.

FIG. 3C is a top view of the plurality of heaters 140 disposed along the plane of the cross section line AA through the body 152, according to another embodiment. FIG. 3C illustrates a plurality of heaters 140 arranged in a polar array in the body 152. Optionally, one or more of thermal chokes 216 may be disposed between the heaters 140. The polar array pattern of the heaters 140 defines the neighboring cells 200, which are thus also be arranged in a polar array. Optionally, thermal chokes 216 may be utilized to isolate adjacent cells 200 from neighboring cells 200.

FIG. 3D is a top view of the plurality of heaters 140 disposed along the plane of the cross section line A-A through the body 152, according to another embodiment. FIG. 3D illustrates a plurality of heaters 140 arranged in the body 152 in concentric channels. The concentric channel pattern of the heaters 140 may be optionally separated by thermal chokes 216. It is contemplated that the heaters 140 and cells 200 may be arranged in other orientations.

Figure 9:
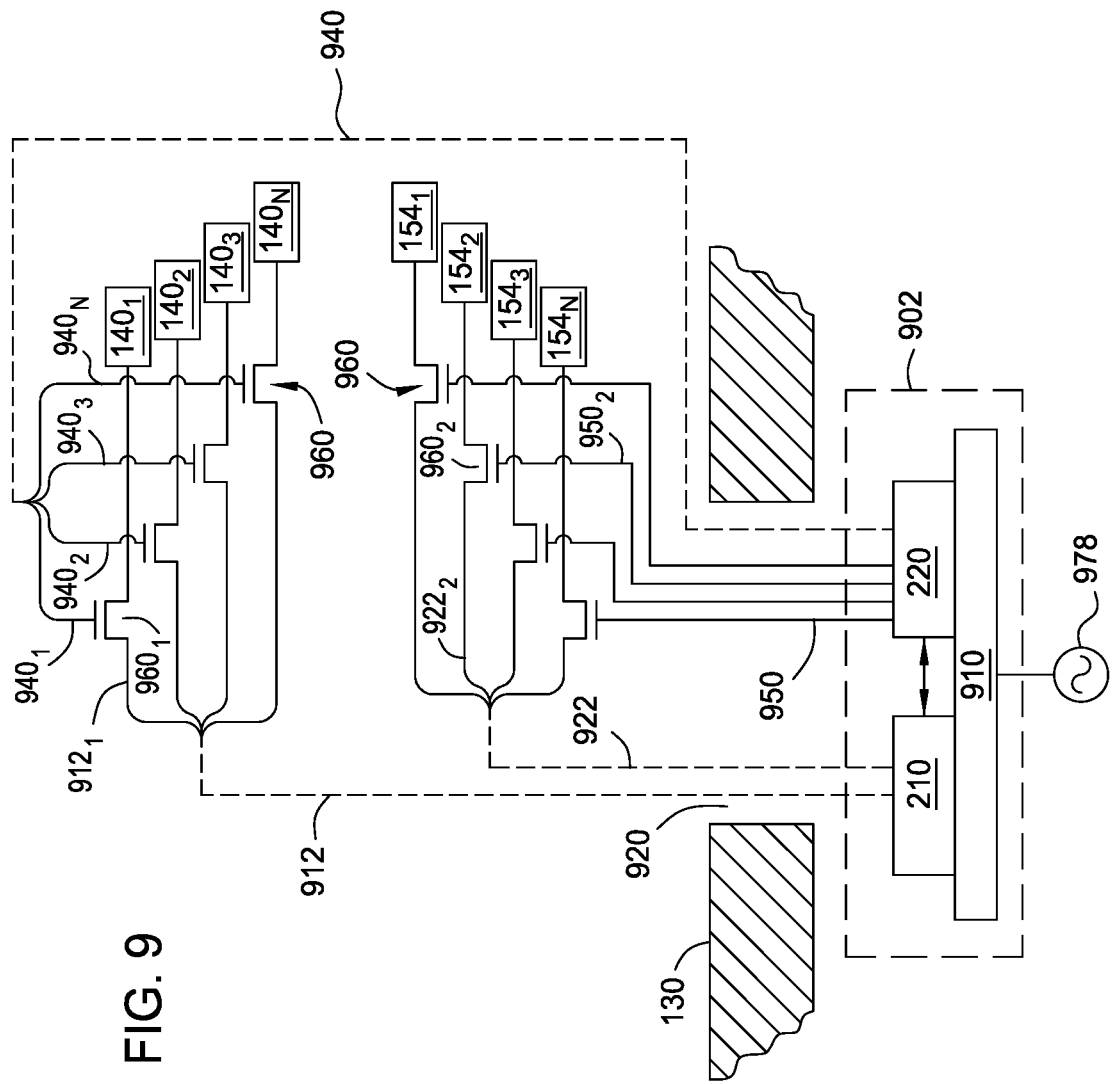
FIG. 9 is a graphical depiction for an alternate wiring schema for the main resistive heaters without the hardware key.

Turning briefly to FIG. 9, a graphical depiction is provided for an alternate wiring schema for the main resistive heaters 154 and the heaters 140. The wiring schema does not make use of the hardware key (802 in FIG. 7). The main resistive heaters 154 and the heaters 140 may be attached to a controller 902. The controller 902 is attached to a power source 978 through a common filter 910. Controller 902 is similar to controller 202 shown in FIGS. 1 and 2 and has a similar version of the electrical power circuit 210 and the optical control circuit 220.

The heaters $140_{(1-n)}$ are figuratively shown and should be understood that heater $140_1$ may represent a large group of heaters in a common zone, or alternatively, all the heaters 140 disposed across the substrate support assembly 126. There are an order of magnitude more heaters 140 than main resistive heaters 154, and therefore, an order of magnitude more connections to the electrical power circuit 210 and the optical control circuit 220.

The electrical power circuit 210 accepts a plurality of power ribbons 912, 922 from both the heaters 140 and the main resistive heaters 154 through a hole or slot 920 formed through the cooling base 130. The ribbons 912, 922, graphically depict a number of power leads for each heater 140 and main resistive heater 154. For example, power ribbon 912 comprises separate power leads for the heaters $140_{(1-n)}$. In one embodiment, each power lead has a switch 960 which may be activated by a respective control lead. It is contemplated that a single ribbon, or even three or more ribbons, may be utilized to route the power leads for the heaters 140 and main resistive heater 154.

The optical control circuit 220 accepts a plurality of control ribbons 940, 950 from both the heaters 140 and the main resistive heaters 154 through the slot 920 formed through the cooling base 130. The ribbons 940, 950 graphically depict a number of control leads for each heater 140 and main resistive heater 154. For example, control ribbon 940 comprises separate control leads. The optical control circuit 220 may take input, from a program, temperature measuring device, an external controller, a user or by other source, and determines which heaters 140 and main resistive heaters 154 to energize. As the optical control circuit 220 uses optics to transmit between the input device, the switches and electrical controller, the optical controller is not subject to RF interference and does not propagate the same to regions outside of the processing chamber. It is contemplated that a single ribbon, or even three or more ribbons, may be utilized to route the control leads.

The control leads 940 provide signals generated by the optical control circuit 220 to control the state of a switch 960. The switch 960 may be a field effect transistor, or other suitable electronic switch. Alternately, the switch 960 may be embedded in an optically controlled circuit board in the electrical power circuit 210. The switch 960 may provide simple cycling for the heaters 154, 140 between an energized (active) state and a de-energized (inactive) state. Alternately, the switch may be a variable resistor, or other suitable device, which can control the amount of power supplied to the heaters 154, 140.

In one embodiment, the controller 202 provides a signal along the control ribbon $940_1$ to instruct the switch $960_1$ to allow 50% of the power to pass therethrough. The power power circuit 210 provides about 10 watts of power along the power ribbon $912_1$. The switch $960_1$ allows 50% of the supplied power to pass through to a heater $140_1$ which heats up with about 5 watts of power.

In another embodiment, the controller 202 provides a signal along the control ribbon $950_2$ to instruct the switch $960_2$ to allow 100% of the power to pass therethrough. The power power circuit 210 provides about 100 watts of power along the power ribbon $922_2$. The switch $960_2$ allows 100% of the supplied power to pass through to the main resistive heater $154_2$ which heats up with about 100 watts of power. Similarly, the main resistive heaters $154_{(1-N)}$ may all be operated from controller 202.

In yet another embodiment, the controller 202 provides a signal along the control ribbon 940 to instruct the switches 960 to be in either an active state that allows power to pass therethrough or an inactive state that prevents power from passing therethrough. The power power circuit 210 provides about 10 watts of power along the power ribbon 912 to each heater 140 coupled to a switch 960 in the active state. The controller 202 independently controls at least one of the duration that the switch 960 remains in the active state and the duty cycle of each of the switch 960 relative to the other switches 960, which ultimately provides controls the temperature uniformity of the substrate support assembly 126 and substrate positioned thereon. The switches 960 controlling power to the main resistive heaters 154 may be similarly controlled.

Figure 10:
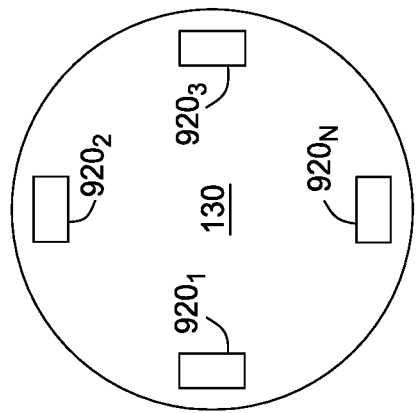
FIG. 10 is a top plan view of a cooling base, configured for the wiring schema depicted in FIG. 9.

In another embodiment, each main resistive heater $154_{(1-N)}$, representing a separate zone, may have a separate controller 202. In this embodiment, the heaters $_{(1-N)}$ common to a zone with one main resistive heater $154_{(1-N)}$ may share the controller 202 with the common main resistive heater $154_{(1-N)}$. For example, if there were four zones, there would be four main resistive heaters $154_{(1-4)}$ and four equally spaced controllers 202. FIG. 10 is a top plan view of the cooling base 130 having holes 960 configured for the wiring schema of four zones and four equally spaced controllers 202.

In other embodiments, separate controllers 202 may be utilized to split up the number of heaters 140 serviced by a single controller. Splitting up the control of the heaters 140 allows for smaller controllers and less space required to route the ribbons through the slots 920 formed through the cooling base, as shown in FIG. 9.

Returning to FIG. 2, the number and density of the heaters 140 contribute to the ability for controlling the temperature uniformity across the substrate to very small tolerances which enables precise process and CD control when processing the substrate 134. Additionally, individual control of one heaters 140 relative to another heaters 140 enables temperature control at specific locations in the substrate support assembly 126 without substantially affecting the temperature of neighboring areas, thereby allowing local hot and cool spots to be compensated for without introducing skewing or other temperature asymmetries. The heaters 140 may have an individual temperature range between about 0.0 degrees Celsius and about 10.0 degrees Celsius with the ability to control the temperature rise in increments of about 0.1 degrees Celsius. In one embodiment, the plurality of heaters 140 in the substrate support assembly 126 in conjunction with the main resistive heaters 154 have demonstrated the ability to control the temperature uniformity of a substrate 134 processed thereon to less than about ±0.3 degrees Celsius. Thus, the heaters 140 allow both lateral and azimuthal tuning of the lateral temperature profile of the substrate 134 processed on the substrate support assembly 126.

Figure 5:
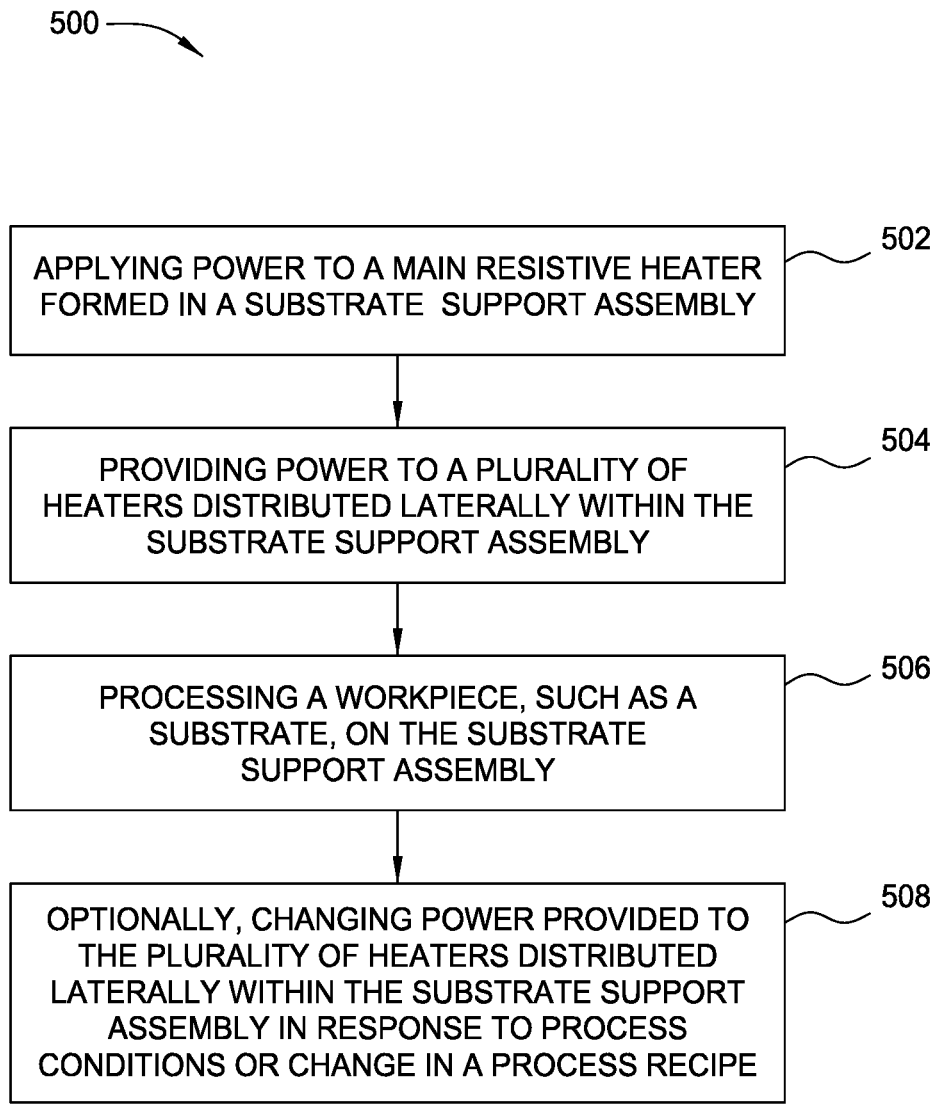
FIG. 5 is a flow diagram of one embodiment of a method for processing a substrate utilizing a substrate support assembly.

FIG. 5 is a flow diagram for one embodiment of a method 500 for processing a substrate utilizing a substrate support assembly, such as the substrate support assembly described above, among others. The method 500 begins at block 502 by applying power to a main resistive heater formed in a substrate support assembly. The main resistive heater may be a single heater, or segmented into zones. The main resistive heater zones may be independently controllable.

At block 504, power is provided to a plurality of heaters distributed laterally within the substrate support assembly. At least two of the heaters generating a predetermined different amount of heat. The difference in heat generated by one heater relative another may be controlled by controlling at least one or more of the duty cycle, voltage, current, duration of power applied to one heater relative another. The power may also be sequentially scanned across heaters.

Control of the power provided to the heaters may be provide through an optical signal interfacing with a controller disposed in the substrate support assembly.

At block 506, a workpiece, such as a substrate, may be processed on the substrate support assembly. For example, the substrate may be processed in a vacuum chamber, for example using a plasma process. The vacuum process, which may be optionally performed in the presence of a plasma within the processing chamber, may be one of etching, chemical vapor deposition, physical vapor deposition, ion implantation, plasma treating, annealing, oxide removal, abatement or other plasma process. It is contemplated that the workpiece may be processed on the temperature controlled surface in other environments, for example, at atmospheric conditions, for other applications.

Optionally, at block 506, power provided to the plurality of heaters distributed laterally within the substrate support assembly may be changed in response to process conditions or a change in a process recipe. For example, the power provided to the plurality of heaters may be changed utilizing commands from the controller 202, or changing one hardware wiring key 802 to a different hardware wiring key 802.

In addition to the examples described above, some additional non-limiting examples may be described as follows.

Example 1. A processing chamber comprising:
  chamber body;
  a substrate support assembly, comprising:
  an upper surface and a lower surface;
  one or more main resistive heaters disposed in the substrate support assembly; and
  a plurality of heaters in column with the main resistive heaters and disposed in the substrate support, wherein a quantity of the heaters is an order of magnitude greater than a quantity of the main resistive heaters and the heaters are independently controllable relative to each other as well as the main resistive heaters.

Example 2. The processing chamber of example 1, wherein the substrate support is an electrostatic chuck.

Example 3. The processing chamber of example 1, wherein electrostatic chuck has a ceramic body.

Example 4. The processing chamber of example 3, wherein at least one of the main resistive heaters and the plurality of heaters are formed on the lower surface of the ceramic body.

Example 5. The processing chamber of example 3, wherein at least one of the main resistive heaters and the plurality of heaters are disposed in a polymer body coupled to the lower surface of the ceramic body.

Example 6. The processing chamber of example 1, further comprising:
  a cooling plate coupled to the substrate support.

Example 7. The processing chamber of example 6, further comprising:
  a heater controller for regulating a temperature output for each heater is coupled to the cooling plate.

Example 8. The processing chamber of example 7, wherein the heater controller includes a fiber optics control circuit and an electrical power control.

Example 9. A substrate support assembly, comprising:
  a substrate support having a substrate support surface and a lower surface;
  a plurality of resistive heaters disposed across the substrate support, the plurality of resistive heaters grouped into concentric zones; and
  a heater controller coupled each group of resistive heaters, the heater controller operable to control which resistive heater within a given zone generates more heat than other resistive heaters within the given zone.

Example 10. The processing chamber of example 9, wherein the heater controller comprises:
  a fiber optics control circuit and an electrical power control.

Example 11. The processing chamber of example 9, wherein the heater controller comprises:
  one or more hardware wiring keys.

While the foregoing is directed to implementations of the present invention, other and further implementations of the invention may be devised without departing from the basic scope thereof, and the scope thereof is determined by the claims that follow.

We claim:

1. An electrostatic chuck (ESC), comprising:
  a dielectric body formed from ceramic material, the dielectric body comprising:
    an upper surface and a lower surface,
    a chucking electrode disposed in the dielectric body,
    main resistive heaters arranged in a plurality of zones and disposed in the dielectric body, and
    a plurality of secondary heaters in the dielectric body between the main resistive heaters and one of the upper surface and the lower surface, wherein a quantity of the secondary heaters is greater than a quantity of the main resistive heaters, each secondary heater and each zone of main resistive heaters coupled to a unique power circuit within the dielectric body, each power circuit configured to independently operate the connected secondary heater and each zone of main resistive heaters between an on state and an off state without changing the on state and off state of any of the other secondary heaters as well as the each zone of the main resistive heaters.

2. The ESC of claim 1, wherein the plurality of secondary heaters are concentrically arranged about a center of the dielectric body into groups of secondary heaters along a common radius.

3. The ESC of claim 1 wherein any one power circuit enables it coupled secondary heater to remain in the off state all other secondary heaters are simultaneously switched to the on state.

4. The ESC of claim 1, further comprising:
  a plurality of switches, each secondary heater coupled to a respective switch providing individual control for each secondary heater; and
  a plurality of control leads, each control lead coupled to a respective individual switch of the plurality of switches and each control lead configured to control one and only one individual secondary heater of the plurality of secondary heaters.

5. The ESC of claim 4, wherein each individual switch is configured to be individually and directly coupled to a power source.

6. The ESC of claim 4, wherein the switch is disposed on a negative terminal of each secondary heaters selectively interrupting the flow of current across the terminal.

7. The ESC of claim 4, wherein the switch is operable to allow 50% of the power to pass through to a respective one of each secondary heater.

8. The ESC of claim 1, wherein the chucking electrode is disposed between the plurality of secondary heaters and the upper surface.

9. A substrate support assembly, comprising:
  a substrate support having a dielectric body, the dielectric body comprising:
    a substrate support surface and a lower surface;
    main resistive heaters arranged in a plurality of zones and coupled to or disposed in the dielectric body; and
    a plurality of resistive secondary heaters disposed in the dielectric body, each of the plurality of resistive secondary heaters and each zone of main resistive heaters is independently controllable relative to all other resistive secondary heaters and zones of the main resistive heater, wherein the plurality of resistive secondary heaters and main resistive heaters are configured to be individually switched by a respective state switch to enable each combination of individual state switches to independently power each combination of resistive secondary heaters relative and zones of main resistive heaters to a quantity of all other resistive secondary heaters and the zones of the main heaters, the quantity being greater than or equal to 2.

10. The substrate support assembly of claim 9, wherein each individual state switch has a control lead configured to individually and directly coupled to a controller.

11. The substrate support assembly of claim 9, wherein the substrate support is an electrostatic chuck and the dielectric body of the electrostatic chuck is ceramic.

12. The substrate support assembly of claim 9, wherein the plurality of resistive secondary heaters are concentrically arranged in groups of resistive secondary heaters along a common radius.

13. The substrate support assembly of claim 12, wherein the main resistive heater is formed on the lower surface of the dielectric body.

14. The substrate support assembly of claim 12, wherein the main resistive heater is disposed in a polymer body coupled to the lower surface of the dielectric body.

15. The substrate support assembly of claim 9, further comprising:
   a cooling plate coupled to the substrate support.

16. A processing chamber comprising:
   a chamber body;
   a controller; and
   a substrate support assembly, having an electrostatic chuck, the electrostatic chuck having a dielectric body formed of a single coherent mass of ceramic material, the dielectric body comprising:
      an upper surface and a lower surface,
      a chucking electrode disposed in the dielectric body,
      main resistive heaters arranged in a plurality of zones and disposed in the dielectric body, and
      a plurality of secondary heaters in the dielectric body between the main resistive heaters and one of the upper surface and the lower surface, wherein a quantity of the secondary heaters is greater than a quantity of the main resistive heaters, each secondary heater and each zone of main resistive heaters coupled to a unique power circuit within the dielectric body, each power circuit configured to independently operate the connected secondary heater and each zone of the main resistive heaters between an on state and an off state without changing the on state and off state of any of the other secondary heaters as well as the plurality of zones of the main resistive heaters.

17. The processing chamber of claim 16, wherein any one secondary heater is configured to remain in the off state while simultaneously switching all other secondary heaters to the on state.

18. The processing chamber of claim 16, wherein the circuit further comprises:
   a plurality of individual state switches coupled to a respective secondary heater; and
a control lead configured to individually and directly each individual state switch to the controller, wherein the state switch modifies a power state for a respective secondary heater.

19. The processing chamber of claim 18, wherein each state switch is disposed on a negative power lead of a respective secondary heater and is configured to selectively interrupt the flow of current across the negative power lead for powering the respective secondary heater.

20. The processing chamber of claim 19, wherein the state switch is operable to allow 50% of the power to pass through to the respectively connected secondary heater.

* * * * *